(12) United States Patent
Bachhuber et al.

(10) Patent No.: US 6,812,877 B2
(45) Date of Patent: Nov. 2, 2004

(54) APPARATUS FOR CONVERTING A DIGITAL VALUE INTO AN ANALOG SIGNAL

(75) Inventors: Marco Bachhuber, München (DE); Ralf-Rainer Schledz, Zolling (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/410,412

(22) Filed: Apr. 9, 2003

(65) Prior Publication Data

US 2003/0218555 A1 Nov. 27, 2003

(30) Foreign Application Priority Data

Apr. 9, 2002 (EP) .............................................. 02007917

(51) Int. Cl.[7] .............................................. H03M 1/66
(52) U.S. Cl. ..................................... 341/144; 341/145
(58) Field of Search ................................. 341/144, 145

(56) References Cited

U.S. PATENT DOCUMENTS 4,503,421 A * 3/1985 Hareyama et al. .......... 341/145
5,554,986 A * 9/1996 Neidorff ..................... 341/145
5,977,898 A   11/1999 Ling et al. .................. 341/144

FOREIGN PATENT DOCUMENTS

JP         05 206 858         8/1993

* cited by examiner

Primary Examiner—Jean Bruner Jeanglaude
(74) Attorney, Agent, or Firm—Laurence A. Greenberg; Werner H. Stemer; Gregory L. Mayback

(57) ABSTRACT

An apparatus converts a digital value including "a" bits into an analog signal and has $2^b$ D/A converters. Here, b is an integer number that is greater than 0. Each of the D/A converters is designed to convert a digital value having "a–b" bits. The digital value that is supplied (for i=1 ... $2^b$) to the ith D/A converter for the purpose of D/A conversion corresponds to the "a–b" most significant bits in the sum of the digital value that will be converted by the apparatus and to i–1. The output signal for the apparatus is the mean value for the output signals from the D/A converters. Such an apparatus can be produced such that it can be accommodated easily and efficiently on a semiconductor chip and, irrespective of the details of protocol implementation, permits a completely linear conversion of the digital value being converted into an analog signal.

4 Claims, 4 Drawing Sheets

APPARATUS FOR CONVERTING A DIGITAL VALUE INTO AN ANALOG SIGNAL

BACKGROUND OF THE INVENTION

FIELD OF THE INVENTION

The present invention relates to an apparatus for converting a digital value including "a" bits into an analog signal.

Such an apparatus generally includes a voltage divider chain in which each value that can be assumed by the digital value to be converted has an associated tap connected to the output connection of the apparatus via a selection switch.

Such an apparatus is shown by way of example in FIG. 1A. The apparatus shown is designed for converting a digital value including three bits into an analog signal.

The voltage divider chain: includes seven resistors R connected in series; has reference voltages REF-HI and REF-LO applied to the ends; and has taps A0 to A7.

The taps A0 to A7 are the starting points for lines L0 to L7, which are connected to an output connection OUT of the apparatus via selection switches S0 to S7.

The selection switches S0 to S7 are controlled by a decoder DEC on the basis of the digital value that will be converted. The decoder DEC has an input connection IN which is used to input the digital value that will be converted into an analog signal.

By way of example, the decoder DEC operates such that:
it closes the selection switch S0 and keeps all the other selection switches open when the digital value to be converted is 000;
it closes the selection switch S1 and keeps all the other selection switches open when the digital value to be converted is 001;
it closes the selection switch S2 and keeps all the other selection switches open when the digital value to be converted is 010;
it closes the selection switch S3 and keeps all the other selection switches open when the digital value to be converted is 011;
it closes the selection switch S4 and keeps all the other selection switches open when the digital value to be converted is 100;
it closes the selection switch S5 and keeps all the other selection switches open when the digital value to be converted is 101;
it closes the selection switch S6 and keeps all the other selection switches open when the digital value to be converted is 110; and
it closes the selection switch S7 and keeps all the other selection switches open when the digital value to be converted is 111.

As a result, the output connection OUT of the arrangement provides an analog voltage corresponding to the digital value.

FIG. 1B shows a symbol used later for the apparatus shown in FIG. 1A.

An apparatus of the type shown in FIG. 1A can also be in a form such that it converts the digital value into two analog signals that can be used as differential signals.

Such an apparatus is shown in FIG. 2A. The apparatus shown in FIG. 2A contains, like the apparatus shown in FIG. 1A, a voltage divider chain which: includes seven resistors R connected in series, has reference voltages REF-HI and REF-LO applied to the ends, and has taps A0 to A7.

The taps A0 to A7 are again the starting points for lines L0 to L7, which are connected to an output connection OUT1 of the apparatus via selection switches S0 to S7.

The taps A0 to A7 are also the starting points for lines L10 to L17, which are connected to a second output connection OUT2 of the apparatus via selection switches S10 to S17.

The selection switches S0 to S7 and S10 to S17 are controlled by a decoder DEC on the basis of the digital value that will be converted; the decoder DEC has an input connection IN which is used to input the digital value that will be converted into an analog signal.

In more precise terms, respectively one of the selection switches S0 to S7 and at the same time one of the selection switches S10 to S17 are closed, while all the other selection switches are respectively open.

As a result, the apparatus shown in FIG. 2A outputs two respective analog voltages. If the selection switches S0 to S7 and S10 to S17 are actuated such that the analog signal corresponding to the digital value which is to be converted is formed by subtracting the signal which is output from the output signal OUT2 from the signal which is output from the output connection OUT1 (or vice versa), this allows interference to be eliminated.

By way of example, the decoder DEC operates such that:
it closes the selection switches S0 and S10 and keeps all the other selection switches open when the digital value to be converted is 000;
that it closes the selection switches S2 and S11 and keeps all the other selection switches open when the digital value to be converted is 001;
that it closes the selection switches S4 and S12 and keeps all the other selection switches open when the digital value to be converted is 010;
that it closes the selection switches S6 and S13 and keeps all the other selection switches open when the digital value to be converted is 011;
that it closes the selection switches S7 and S13 and keeps all the other selection switches open when the digital value to be converted is 100;
that it closes the selection switches S7 and S12 and keeps all the other selection switches open when the digital value to be converted is 101;
that it closes the selection switches S7 and S11 and keeps all the other selection switches open when the digital value to be converted is 110; and
that it closes the selection switches S7 and S10 and keeps all the other selection switches open when the digital value to be converted is 111.

FIG. 2B shows a symbol used later for the apparatus shown in FIG. 2A.

If an apparatus as shown in FIG. 1A or as shown in FIG. 2A is part of an integrated circuit, the voltage divider chain is generally in the form of a long resistive track, i.e. without discrete resistive components. In this case, the resistive track and the taps are in a form and are arranged such that the resistive track between two adjacent taps has a respective electrical resistance which corresponds to the electrical resistance of one of the resistors R in the arrangements shown in FIGS. 1A and 2A.

An apparatus having a voltage divider chain implemented in this manner is shown in FIG. 3. The apparatus shown in FIG. 3 corresponds to the apparatus shown in FIG. 2A. Identical references denote components which are the same or which correspond to one another. The only difference between the apparatus shown in FIG. 3 and the apparatus shown in FIG. 2A is that the apparatus shown in FIG. 3 has no discrete resistors R. Instead, a resistive track RB is provided which, between adjacent taps, has a respective electrical resistance which corresponds to the electrical resistance of one of the resistors R in the arrangements shown in FIGS. 1A and 2A.

By omitting the lines S10 to S17, the selection switches S10 to S17 and the second output connection OUT2, an apparatus is obtained which corresponds to the apparatus shown in FIG. 1A.

For the sake of completeness, it will be noted that the resistive track RB is formed by a polylayer on the semiconductor chip containing the integrated circuit. Of the lines L0 to L7 and L10 to L17 coming from the taps A0 to A7, the first portion is likewise formed by a polylayer and the second portion is formed by a metal layer provided above the polylayer. The crossover for the lines from the polylayer into the metal layer, more precisely the plated-through hole provided for this purpose, is provided in order to connect these layers at a great distance from the taps A0 to A7 so that the plated-through hole cannot have any effect on the current flowing through the resistive track. In addition, it will be noted that no or just a very small current can flow through the lines L0 to L7 and L10 to L17, because this would affect the D/A conversion. This incidentally also applies to all other apparatus in which D/A conversion is carried out using voltage divider chains.

Implementing the voltage divider chain using a resistive track is relatively easy, but under some circumstances it gives rise to problems when integrating a D/A converter containing such a resistive track into an integrated circuit. This is particularly so when the D/A converter is intended to convert a digital value including a large number of bits into an analog signal. In this case, a very large number of taps need to be provided along the resistive track, which makes the resistive track very long. This results in the D/A converter having an unfavorable shape (long and narrow), which makes it difficult or in some cases even impossible to position the D/A converter on the semiconductor chip carrying the integrated circuit such that the chip area taken up by the integrated circuit is minimal.

To avoid this problem, the resistive track could be convoluted meandrously. An apparatus having a meandrously convoluted resistive track is illustrated in FIG. 4.

The arrangement shown in FIG. 4 largely corresponds to the arrangement shown in FIG. 3. The only difference is the shape of the resistive track RB.

The resistive track shown in FIG. 4 has vertically running sections RBV1 to RBV4 and horizontally running sections RBH1 to RBH3.

As can be seen from FIG. 4, the use of a meandrously convoluted resistive track RB allows the length/width ratio of the apparatus containing the resistive track to be varied as desired, which makes it possible to arrange such an apparatus on a semiconductor chip more easily and more efficiently.

However, a meandrously convoluted resistive track RB also has drawbacks.

One of these drawbacks is that the resistance of the resistive track RB is different at the corners, i.e. at the crossings between the vertically running sections RBV and the horizontally running sections RBH, than in the sections which run straight. Since the magnitude of this resistance varies greatly in practice, it is unavoidable that the resistance established between the taps connected to one another via a horizontal section RBH of the resistive track is different than between taps connected to one another via a vertical section RBV of the resistive track.

Another drawback of a meandrously convoluted resistive track RB is that the vertical sections RBV of the resistive track RB need to be a relatively great distance apart on account of the selection switches S0 to S7 and S10 to S17 which need to be provided between them, which means that the horizontal sections RBH of the resistive track need to be relatively long. The result of this is that the taps connected to one another via the horizontal sections RBH of the resistive track are connected to one another via a relatively long portion of the resistive track, and this in turn requires that the taps connected to one another via vertical sections RBV of the resistive track likewise need to be such a great distance apart. Otherwise, the taps would be distributed unevenly over the resistive track, which would result in nonlinear conversion of the digital value which is to be converted into an analog signal. The resultant large distances between the taps mean that an apparatus with a meandrously convoluted resistive track takes up more space than an apparatus with a resistive track running straight.

The problems cited could be overcome by running the horizontal sections RBH of the resistive track RB in a metal layer on the semiconductor chip containing the apparatus.

However, this would require acceptance of the drawback that the resistive track has contact points, more precisely plated-through holes for connecting the polylayer and the metal layer. These contact points have greatly varying resistances, which means that the resistances of the resistive track's sections running between adjacent taps can vary, and can therefore likewise not ensure linear conversion of the digital value which is to be converted into an analog signal.

SUMMARY OF THE INVENTION

It is accordingly an object of the invention to provide an apparatus for converting an analog signal into a digital signal, which overcomes the above-mentioned disadvantages of the prior art apparatus of this general type.

In particular, it is an object of the invention to provide an apparatus for converting an analog signal into a digital signal that can be easily and efficiently accommodated on a semiconductor chip and that ensures a completely linear conversion of the digital value into an analog signal.

With the foregoing and other objects in view there is provided, in accordance with the invention, an apparatus for converting a digital value having a bits into an analog output signal. The apparatus including: $2^b$ D/A converters, b being an integer greater than 0; and an output. For i=1 . . . $2^b$, a respective digital value having a−b bits is supplied to an $i^{th}$ one of the D/A converters. Each $i^{th}$ one of the D/A converters is for converting the respective digital value having a−b bits into an analog value. The respective digital value having a−b bits corresponds to a−b most significant bits in a sum of the digital value having a bits and a value $x_i$. The value $x_i$ is selected to satisfy:

$$\sum_{i=1}^{2^b} x_i = \sum_{i=1}^{2^b} (i-1),$$

and $x_i=(i-1)+n2^b;$ where n is an integer.

The output provides the analog output signal as a mean value obtained from the analog value from each one of the D/A converters.

In accordance with an added feature of the invention, $x_i$ is equal to i−1.

In other words, the inventive apparatus is distinguished by the features listed below: The apparatus has $2^b$ D/A converters. Here, b is an integer number which is greater than 0, and each of the D/A converters is designed to convert a digital value including a–b bits. The digital value that is supplied (for i=1 . . . $2^b$) to the $i^{th}$ D/A converter for the purpose of D/A conversion corresponds to the a–b most significant bits in the sum of the digital value that is to be converted by the apparatus and to a value $x_i$. The values $x_i$ are selected such that they satisfy the conditions:

$$\sum_{i=1}^{2^b} x_i = \sum_{i=1}^{2^b} (i-1),$$

and $x_i(i-1)+n2^b;$ where n is any integer. The output signal from the apparatus is the mean value for the output signals from the D/A converters.

The fact that the D/A converters are designed for the purpose of D/A converting digital values including only "a–b" bits, means that the voltage divider chain or the resistive track forming this chain in the D/A converters needs to have far fewer taps than is the case with a D/A converter which is designed for the purpose of D/A conversion of a digital value including "a" bits. As a consequence of this, the voltage divider chain or the resistive track forming it can likewise be much shorter. This means that the apparatus can be given a shape which can be accommodated on a semiconductor chip more easily and more efficiently, even without meandrous convolution of the voltage divider chain or resistive track. Added to this is the fact that the shape can be varied as desired by altering the arrangement of the plurality of D/A converters and/or of the other apparatus components. This means that no meandrous convolution of the voltage divider chain or of the resistive track forming it and no acceptance of the associated problems and drawbacks is required in order to produce a simply designed and efficiently usable apparatus for converting a digital value into an analog signal, which apparatus also ensures a completely linear conversion of a digital value into an analog signal.

Other features which are considered as characteristic for the invention are set forth in the appended claims.

Although the invention is illustrated and described herein as embodied in an apparatus for converting a digital value into an analog signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The apparatus described below is part of an integrated circuit, for example a microcontroller. The apparatus can also be part of any other integrated circuit, however, and can also be part of a normal, i.e. nonintegrated, circuit.

The subsequently described apparatus for converting a digital value into an analog signal contains a plurality of D/A converters, but each of these is designed only to convert a digital value that has fewer bits than the digital value to be converted by the apparatus.

In more precise terms, the situation is that an apparatus intended to convert a digital value including "a" bits into an analog value has $2^b$ D/A converters. Each of the D/A converters is designed to convert a digital value which has b bits fewer than the digital value which is to be converted by the apparatus, where b is an integer number that is greater than 0.

The plurality of D/A converters are supplied with the same or different digital values, with the digital value to be converted by the apparatus governing which D/A converter is supplied which digital value. In more precise terms, the situation is that the digital value which—for i=1 . . . $2^b$—is supplied to the ith D/A converter for the purpose of D/A conversion corresponds to the a–b most significant bits in the sum of the digital value that is to be converted by the apparatus and a value $x_i$. Here, the values $x_i$ are selected such that they satisfy the conditions:

$$\sum_{i=1}^{2^b} x_i = \sum_{i=1}^{2^b} (i-1);$$

and $x_i=(i-1)+n2^b,$ where n is any integer number.

In the example described below, $x_i$ is respectively i−1. However, there is no restriction to this; it is also possible to use other values for $x_i$ which satisfy the conditions cited above.

The apparatus's output signal used is the mean value for the output signals from the D/A converters.

Figure 5:
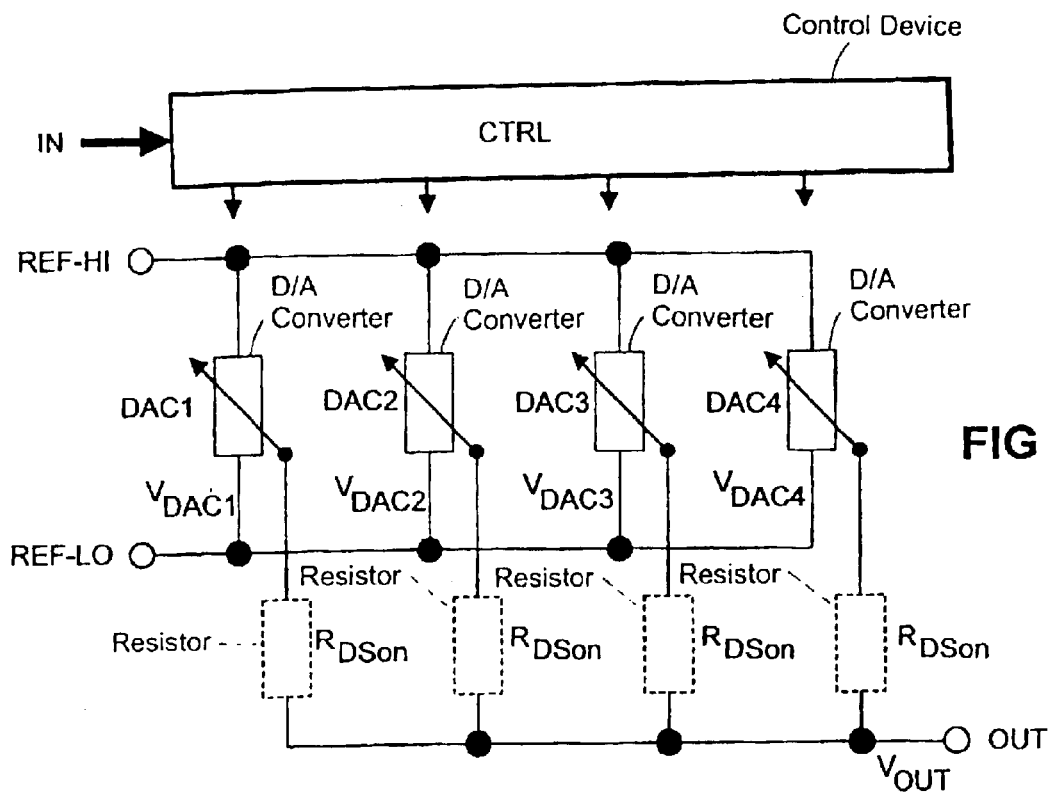
FIG. 5 is a diagram of a first exemplary embodiment of the inventive apparatus for converting a digital value into an analog signal.

Referring now to the figures of the drawing in detail and first, particularly, to FIG. 5 thereof, there is shown the design of such an apparatus.

The apparatus shown in FIG. 5 is designed for a=6 and b=2. Before continuing, it will be pointed out that an apparatus of the type shown in FIG. 5 can also be designed for any other values for a and b. The changes which need to be made for this purpose will become clear from the description below of the design and operation of the apparatus shown in FIG. 5 and require no more detailed explanation. Moreover, a similar situation also applies to the apparatus shown in FIGS. 6 to 8.

Figure 1A:
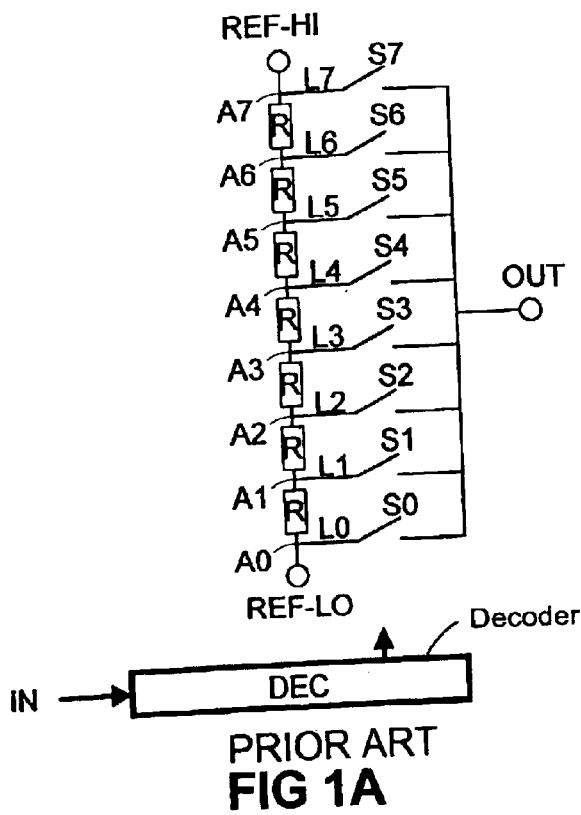
FIG. 1A is a diagram of a conventional apparatus for converting a digital value into an analog signal.
Figure 1B:
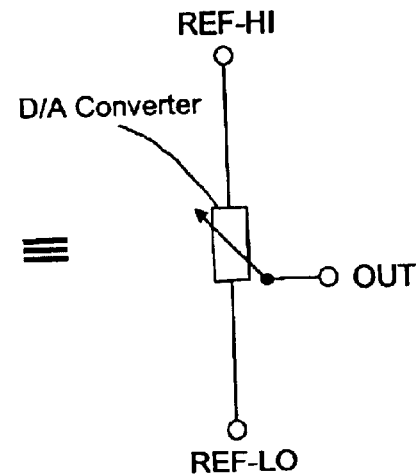
FIG. 1B is a diagram of a symbol used to designate the apparatus shown in FIG. 1A.

The apparatus shown in FIG. 5 is designed to convert a digital value including six bits into an analog signal and has four D/A converters DAC1 to DAC4. The D/A converters DAC1 to DAC4 are respectively designed to convert a digital signal including four bits into an analog signal and are respectively of the same design as the D/A converter shown in FIG. 1A, but with—as in the case of the D/A converter shown in FIG. 3—the voltage divider chain being formed by a resistive track. The analog output signals $V_{DAC1}$ to $V_{DAC4}$ from the D/A converters DAC1 to DAC4 are sent to an output connection OUT on the apparatus via resistors $R_{Dson}$. This means that the output connection OUT outputs a voltage $V_{OUT}$ corresponding to the mean value for the voltages $V_{DAC1}$ to $V_{DAC4}$ which are output from the D/A converters DAC1 to DAC4. In more precise terms, the following applies:

$$V_{OUT}=0.25*(V_{DAC1}+V_{DAC2}+V_{DAC3}+V_{DAC4}).$$

For the sake of completeness, it will be pointed out that the mean value used as the output signal from the apparatus could also be formed in a different way.

The apparatus shown in FIG. 5 also contains a control device CTRL which supplies the D/A converters with the digital values that need to be converted into an analog signal by the D/A converters.

As already mentioned above, the apparatus shown in FIG. 5 is designed to convert a digital value including six bits into an analog signal. This digital value including six bits is supplied to the control device CTRL as an input signal using an input connection IN on the control device.

The Control Device CTRL:

outputs the most significant four bits in the digital six-bit value to the D/A converter DAC1;

outputs a digital value corresponding to the most significant four bits in the six-bit value increased by one to the D/A converter DAC2;

outputs a digital value corresponding to the most significant four bits in the six-bit value increased by two to the D/A converter DAC3; and outputs a digital value corresponding to the most significant four bits in the six-bit value increased by three to the D/A converter DAC4.

The D/A converters DAC1 to DAC4 convert the digital values supplied to them by the control device CTRL into an analog signal, and these analog signals form the mean value already mentioned above which is used as the output signal from the apparatus shown in FIG. 5.

Figure 6:
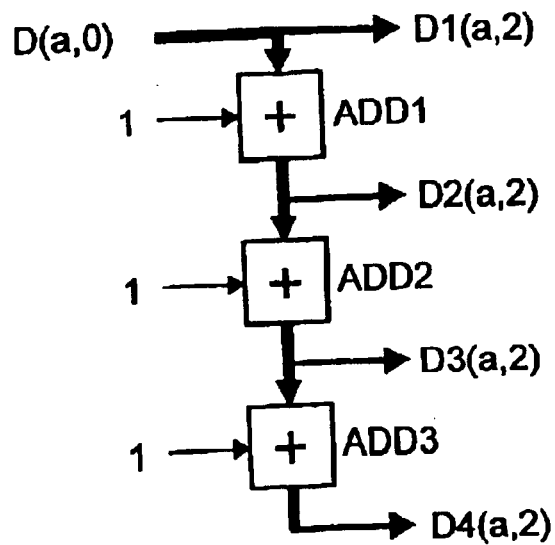
FIG. 6 is a diagram of a control device for actuating the D/A converters contained in the apparatus shown in FIG. 5.

An exemplary embodiment of a control device CTRL actuating the D/A converters DAC1 to DAC4 as mentioned is shown in FIG. 6.

The control device shown in FIG. 6 has an input connection into which data D(a,0) are input, and has four output connections that are used to output data D1(a,2), D2(a,2), D3(a,2), and D4(a,2). The data D(a,0) supplied to the control device represent the digital six-bit value that is to be converted into an analog signal by the apparatus shown in FIG. 5, and the data D1(a,2), D2(a,2), D3(a,2) and D4(a,2) which are output from the control device are the digital four-bit values supplied to the D/A converters DAC1 to DAC4 which the D/A converters DAC1 to DAC4 convert into an analog signal. The label for the digital data which are input and output contains brackets containing information about the data in question: the first value in the brackets indicates the number of bits which the data in question include, and the second value in the brackets indicates the number of least significant bits which are cut off or left out of consideration thereby.

The control device contains three series-connected adders ADD1, ADD2 and ADD3, each of which increases the value supplied to it by 1. The first adder ADD1 is supplied the value D(a,0) which is supplied to the control device. The first adder ADD1 increases this value by 1 and outputs the result to the second adder ADD2. The second adder ADD2 increases the value supplied to it by 1 and outputs the result to the third adder ADD3. The third adder ADD3 increases the value supplied to it by 1 and outputs the result. The data D1(a,2) output from the control device are the a−2, i.e. the four most significant bits of the data D(a,0) supplied to the control device. The data D2(a,2) are the a−2, i.e. the four most significant bits of the data output by the first adder ADD1. The data D3(a,2) are the a−2, i.e. the four most significant bits of the data output by the second adder ADD2. The data D4(a,2) are the a−2, i.e. the four most significant bits of the data output by the third adder ADD3.

The control device actuates the D/A converters DAC1 to DAC4 in the manner mentioned in general form in the description referring to FIG. 5.

If increasing the digital six-bit value involves exceeding the value 111111, that is to say the occurrence of an overflow, which can be the case when the digital six-bit value is 111110, for example, the D/A converter which would need to be supplied with the four most significant bits of the result which has overflowed is supplied an overflow signal. Reception of an overflow signal by a D/A converter prompts the D/A converter in question to output an analog signal which is tapped off at an additional tap, subsequently referred to as the overflow tap, on the resistive track. This overflow tap is provided between the tap associated with the digital value 1111 and the reference-voltage connection for the reference voltage REF-HI, which means that the D/A converters DAC1 to DAC4 have not only taps A0 to A15 but also a further tap A16, with this further tap A16 being used as the overflow tap. The further tap A16 is connected, like all the other taps, to the output connection of the respective D/A converter via an associated dedicated line and an associated dedicated selection switch. If a D/A converter is supplied an overflow signal, it closes the selection switch associated with the overflow tap and leaves the selection switches associated with all the other taps open.

Figure 7:
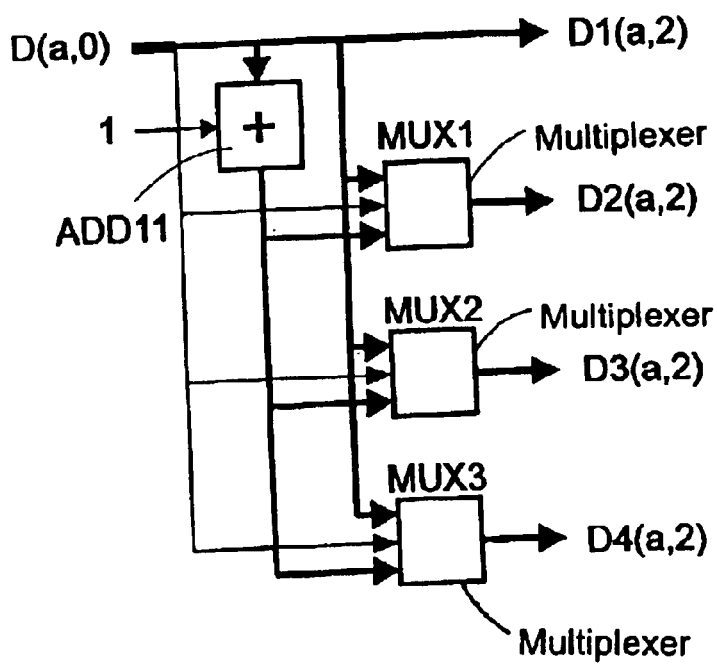
FIG. 7 is a diagram of another form of control device for actuating the D/A converters contained in the apparatus shown in FIG. 5.

A further control device actuating the D/A converters DAC1 to DAC4 in the manner described is shown in FIG. 7.

The control device shown in FIG. 7 has, like the control device shown in FIG. 6, an input connection into which data D(a,0) are input, and has four output connections which are used to output data D1(a,2), D2(a,2), D3(a,2) and D4(a,2). In the example under consideration, the data D(a,0) supplied to the control device represent the digital six-bit value which is to be converted into an analog signal by the apparatus shown in FIG. 5, and the data D1(a,2), D2(a,2), D3(a,2) and D4(a,2) output from the control device CTRL are the digital four-bit values supplied to the D/A converters DAC1 to DAC4 which the D/A converters DAC1 to DAC4 need to convert into an analog signal. The label for the digital data which are input and output contains brackets containing information about the data in question: the first value in the brackets indicates the number of bits which the data in question include, and the second value in the brackets indicates the number of least significant bits which are cut off.

The control device contains an adder ADD11 which increases the value supplied to it by 1. The adder ADD11 is supplied the four most significant bits of the value D(a,0) supplied to the control device.

The control device also contains three multiplexers MUX1 to MUX3. Each of the multiplexers is supplied with:

as input signals, the most significant four bits of the data D(a,0) supplied to the control device and the output signal from the adder ADD11; and as a control signal, the least significant two bits of the data D(a,0) supplied to the control device.

The multiplexers MUX1 to MUX3 are configured such that:

the multiplexer MUX1 switches through the output signal from the adder ADD11 when the control signal has the value 11, and otherwise switches through the most significant four bits of the data D(a,0) supplied to the control device;

the multiplexer MUX2 switches through the output signal from the adder ADD11 when the control signal has the value 10 or 11, and otherwise switches through the most significant four bits of the data D(a,0) supplied to the control device; and the multiplexer MUX3 switches through the output signal from the adder ADD11 when the control signal has the value 01, 10, or 11, and otherwise switches through the most significant four bits of the data D(a,0) supplied to the control device.

The output connection on the control device which is used to output the data D1(a,2) is always used to output the most significant four bits of the data D(a,0) supplied to the control device. The output connection on the control device which is used to output the data D2(a,2) is used to output the data switched through by the multiplexer MUX1. The output connection on the control device which is used to output the data D3(a,2) is used to output the data switched through by the multiplexer MUX2. The output connection on the control device which is used to output the data D4(a,2) is used to output the data switched through by the multiplexer MUX3.

Hence, the control device shown in FIG. 7 outputs exactly the same data as the control device shown in FIG. 6.

The control device shown in FIG. 7 can be produced more easily and in a smaller form than the control device shown in FIG. 6, however, because it contains only one adder and because the multiplexers can be easily produced in a small form.

If the adder in the control device shown in FIG. 7 overflows, the D/A converters to which the output signal from the adder ADD11 needs to be supplied are supplied an overflow signal. This overflow signal prompts the same actions in the D/A converters in question as the overflow signal which is output from the control device shown in FIG. 6.

The resistors $R_{DSon}$ already mentioned above limit the currents which are drawn from the output connections of the D/A converters DAC1 to DAC4 or flow into these. The fact that certain currents flow in this case is unavoidable because the analog signals which are output from the output connections of the D/A converters DAC1 to DAC4 and are combined at the output connection OUT of the apparatus can have different voltages on account of the different digital values which they may need to convert. If they are excessively large, such currents can affect the conversion result, because the respectively closed selection switches in the D/A converters impress them into the resistive track therein or draw them from the resistive track, which for its part can in turn result in an alteration of the voltage which is established on the tap connected to the output connection of the D/A converter via the selection switch. The resistors $R_{DSon}$ can be omitted if the resistances of the respective D/A converters' respectively closed selection switches are large enough to limit the size of the compensating current to a sufficiently great extent.

The analog signal which is output via the output connection OUT of the apparatus shown in FIG. 5 has exactly the same voltage as the analog output signal from a single D/A converter with a correspondingly higher resolution. That is to say that $2^b$ D/A converters with "a–b" bit resolution can achieve the same result as a single D/A converter with "a" bit resolution.

Although the apparatus shown in FIG. 5 contains a plurality of, more precisely $2^b$, D/A converters, it is no larger than a single D/A converter with "a" bit resolution. The reason for this is that a D/A converter with "a–b" bit resolution requires a much shorter resistive track than a D/A converter with "a" bit resolution. In more precise terms, the resistive track of a D/A converter with "a–b" bit resolution is shorter by a factor of $2^b$ than the resistive track of a D/A converter with "a" bit resolution (because the number of taps in a D/A converter with "a–b" bit resolution can be smaller by a factor of $2^b$ than the number of taps in a D/A converter with "a" bit resolution).

The much shorter length of the resistive track in a D/A converter with "a–b" bit resolution means that there is generally no need to convolute the resistive track meandrously, which means that the problems cited at the outset which arise in the case of meandrously convoluted resistive tracks cannot arise. That is to say the resistive tracks have a homogeneous resistance over their entire length.

On account of the fact that the apparatus described contains a plurality of D/A converters which can be arranged independently of one another, the apparatus can be designed such that it has a shape which can be placed with little complexity on a semiconductor chip such that the semiconductor chip has the desired shape and no chip area is wasted, i.e. remains unused.

Figure 2A:
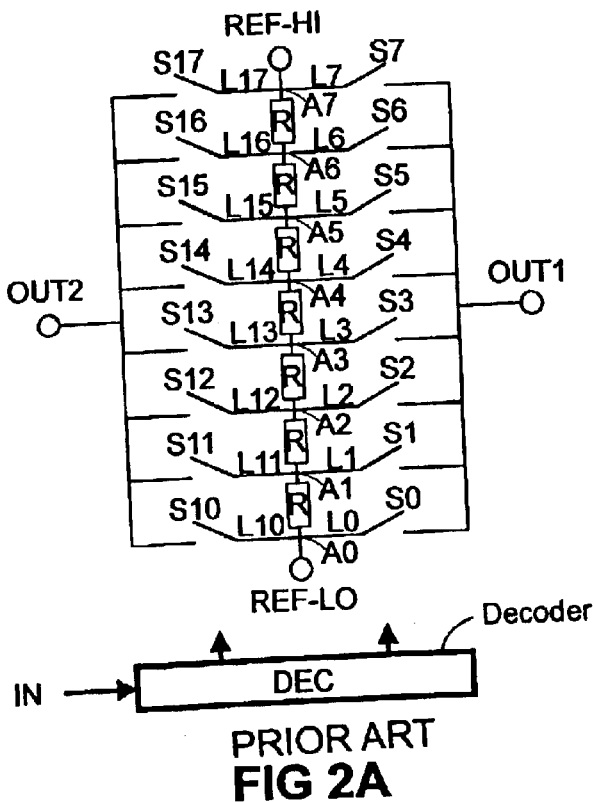
FIG. 2A is a diagram of another conventional apparatus for converting a digital value into an analog signal.
Figure 2B:
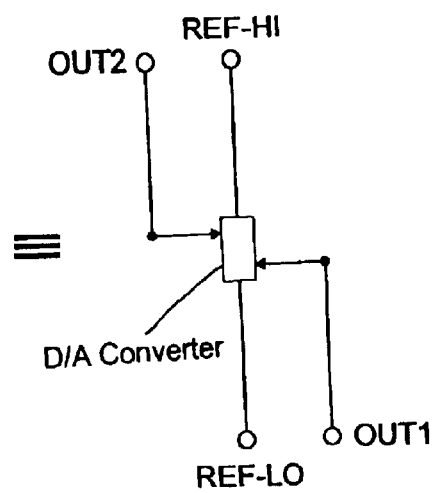
FIG. 2B is a diagram of a symbol used to designate the apparatus shown in FIG. 2A.
Figure 3:
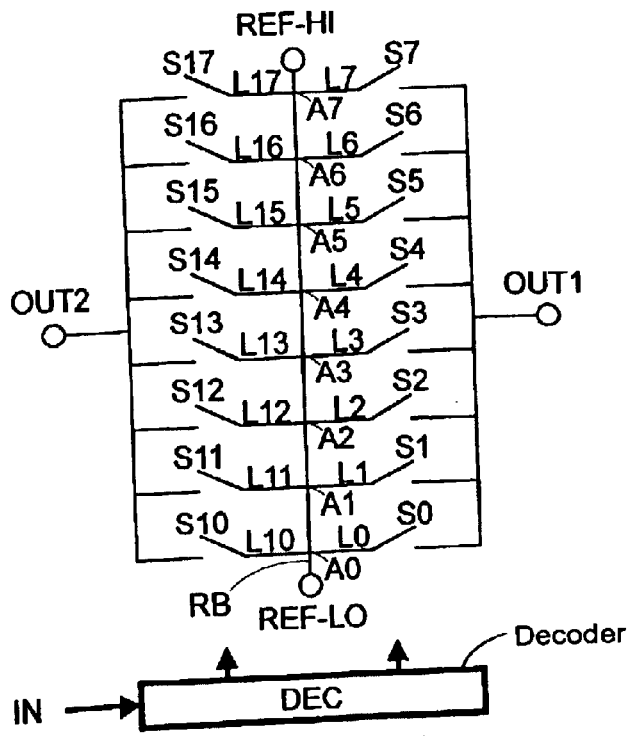
FIG. 3 is a diagram of another conventional apparatus for converting a digital value into an analog signal.
Figure 4:
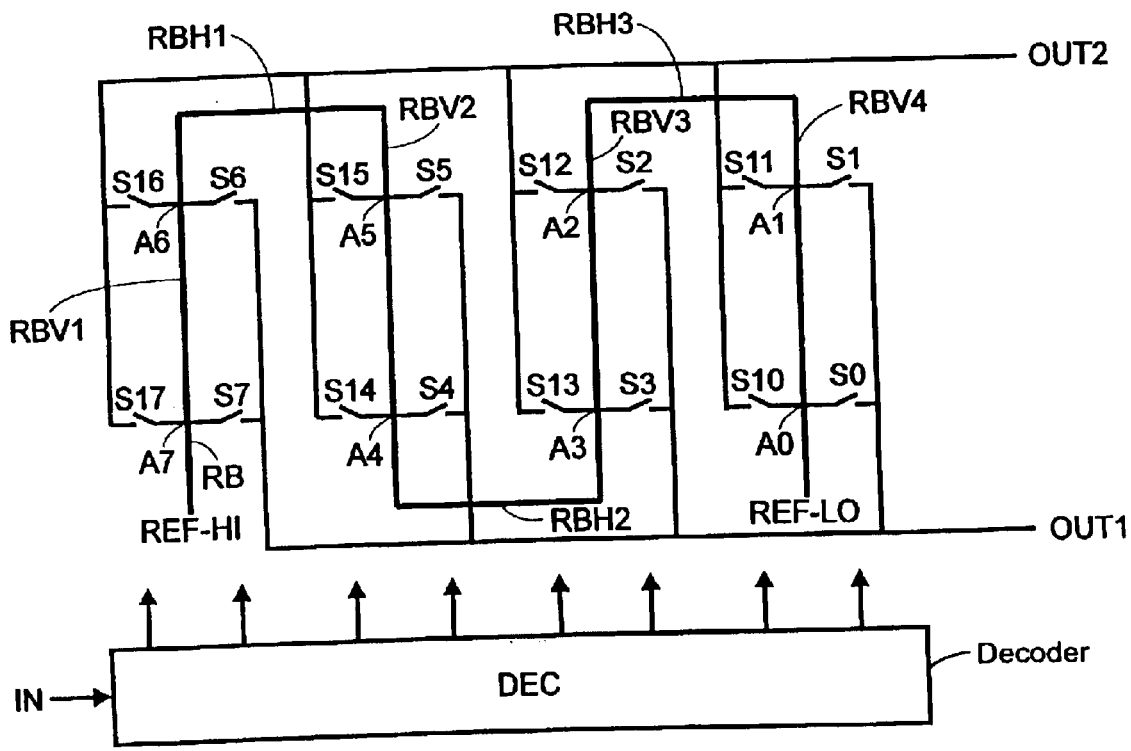
FIG. 4 is a diagram of an apparatus for converting a digital value into an analog signal which does not have the drawbacks of the apparatus shown in FIG. 3.

The apparatus shown in FIG. 5 can also be designed using D/A converters which deliver differential output signals, for example using D/A converters of the type shown in FIG. 2A or FIG. 3. Such an apparatus is shown in FIG. 8.

Figure 8:
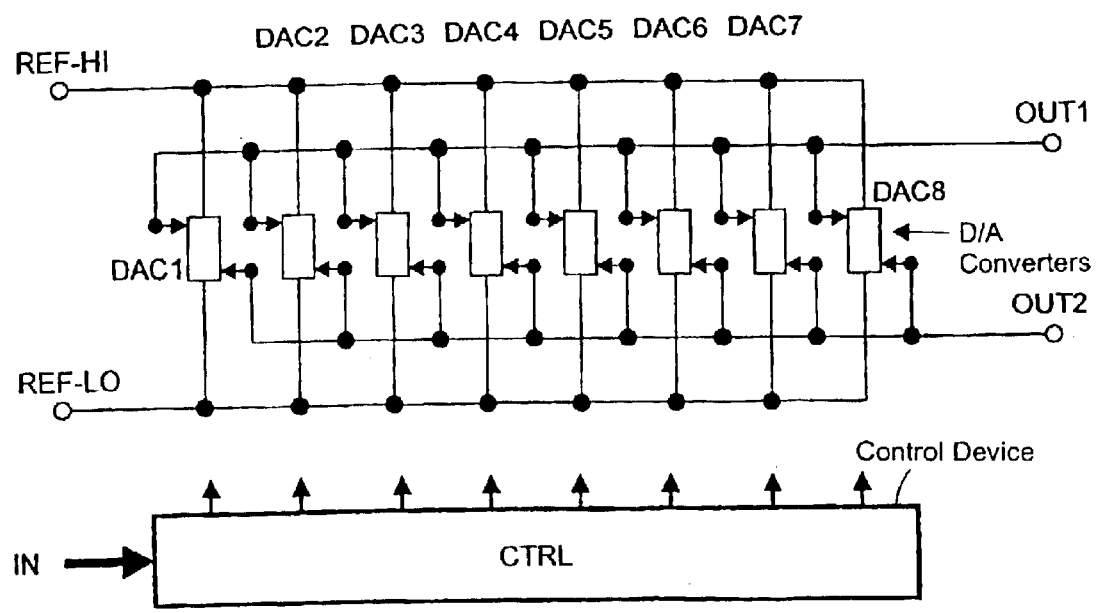
FIG. 8 is a diagram of a second exemplary embodiment of the inventive apparatus for converting a digital value into an analog signal.

The apparatus shown in FIG. 8 contains eight D/A converters DAC1 to DAC8, each of which is designed to convert a digital value including "c" bits into an analog signal, and can therefore be used to convert a digital value including "c+3" bits into an analog signal.

We claim:

1. An apparatus for converting a digital value having a bits into an analog output signal, the apparatus comprising:

$2^b$ D/A converters, b being an integer greater than 0; and an output;

for i=1 ... $2^b$, a respective digital value having a–b bits being supplied to an $i^{th}$ one of said D/A converters, each said $i^{th}$ one of said D/A converters for converting the respective digital value having a–b bits into an analog value, the respective digital value having a–b bits corresponding to a–b most significant bits in a sum of the digital value having a bits and a value $x_i$;

$x_i$ being selected to satisfy:

$$\sum_{i=1}^{2^b} x_i = \sum_{i=1}^{2^b} (i-1),$$

and $x_i=(i-1)+n2^b;$ n being an integer; and said output providing the analog output signal as a mean value obtained from the analog value from each one of said D/A converters.

2. The apparatus according to claim 1, wherein $x_i$ is equal i−1.

3. An apparatus for converting a digital value having a bits into an analog output signal, the apparatus comprising:

$2^b$ D/A converters, b being an integer greater than 0;

for i−1 ... $2^b$, a respective digital value having a−b bits being supplied to an $i^{th}$ one, of said D/A converters, each said $i^{th}$ one of said D/A converters for converting the respective digital value having a−b bits into an analog value, the respective digital value having a−b bits corresponding to a−b most significant bits in a sum of the digital value having a bits and a value $x_i$;

$x_i$ being selected to satisfy:

$$\sum_{i=1}^{2^b} x_i = \sum_{i=1}^{2^b} (i-1),$$

and $x_i=(i-1)+n2^b;$ n being an integer and $x_i$ being equal to i−1;

an output providing the analog output signal as a mean value obtained from the analog value from each one of said D/A converters;

a control device for determining the respective digital value supplied to each said $i^{th}$ one of said D/A converters;

said control device including $2^b$−1 adders connected in series, each one of said adders outputting a digital value, a first one of said adders adding one to the digital value having a bits to provide an output signal, further ones of said adders being supplied with the digital value from a respective one of said adders configured upstream and increasing the digital value from said respective one of said adders by one;

said control device forming the respective digital value having a−b bits, which is supplied to a first one of said D/A converters, as a most significant a−b bits in the digital value having a bits; and said control device forming the respective digital value having a−b bits supplied to each respective further one of said D/A converters as a most significant a−b bits in the digital value from a respective one of said adders.

4. The apparatus according to claim 2, further comprising;

a control device for determining the respective digital value supplied to each said $i^{th}$ one of said D/A converters;

said control device including an adder for adding one to a most significant a−b bits in the digital value having a bits, said adder providing an output signal;

said control device including $2^b$−1 multiplexers controlled by a least significant b bits in the digital value having a bits;

said multiplexers providing output signals;

said control device, dependent on the least significant b bits in the digital value having a bits, switching through either the output signal from said adder or the most significant a−b bits in the digital value having a bits;

said control device supplying the most significant a−b bits in the digital value having a bits to a first one of said D/A converters; and said control device supplying the output signals from said multiplexers to further ones of said D/A converters.

* * * * *

UNITED STATES PATENT AND TRADEMARK OFFICE
CERTIFICATE OF CORRECTION

PATENT NO. : 6,812,877 B2
DATED : November 2, 2004
INVENTOR(S) : Marco Bachhuber et al.

It is certified that error appears in the above-identified patent and that said Letters Patent is hereby corrected as shown below:

<u>Column 11,</u>
Line 21, should read as follows:

-- being supplied to an $i^{th}$ one of said D/A converters, --

Signed and Sealed this

First Day of March, 2005

JON W. DUDAS
*Director of the United States Patent and Trademark Office*